United States Patent [19]
Boulay et al.

[11] Patent Number: 5,941,621
[45] Date of Patent: Aug. 24, 1999

[54] CABINET SLIDE MOUNTING BRACKET

[75] Inventors: Steven G. Boulay, Shrewsbury, Mass.; Michael L. Joseph, Nashua, N.H.; Richard M. Braun, Millis, Mass.

[73] Assignee: Digital Equipment Corporation, Houston, Tex.

[21] Appl. No.: 08/807,935

[22] Filed: Feb. 28, 1997

[51] Int. Cl.⁶ .................................................. A47B 88/00
[52] U.S. Cl. .................................. 312/334.4; 312/223.1; 312/334.5; 248/906
[58] Field of Search .................................. 52/712, 720.1, 52/739.1; 248/674, 675, 906, 909, 200.1, 201; 312/334.1, 334.8, 334.41, 334.5, 334.4, 223.1; 211/189

[56] References Cited

U.S. PATENT DOCUMENTS

| | | | |
|---|---|---|---|
| 1,156,885 | 10/1915 | Caine ....................................... | 248/906 |
| 1,789,124 | 1/1931 | Weaver ................................... | 248/906 |
| 3,092,429 | 6/1963 | Barnes ................................. | 312/334.8 |
| 3,275,396 | 9/1966 | Hillson et al. ...................... | 312/334.17 |
| 4,447,030 | 5/1984 | Nattel ....................................... | 248/906 |
| 5,571,256 | 11/1996 | Good et al. ........................... | 312/223.1 |
| 5,833,337 | 11/1998 | Kofstad ................................ | 312/334.8 |

*Primary Examiner*—Peter M. Cuomo
*Assistant Examiner*—Gerald A. Anderson
*Attorney, Agent, or Firm*—Hamilton, Brook, Smith & Reynolds, P.C.

[57] ABSTRACT

A bracket for mounting a sliding fixture to a computer cabinet for enabling a computer to slide relative to the computer cabinet includes a bracket body portion having first and second ends. A first pattern of holes is formed through the bracket body portion enabling the bracket to be mounted to the sliding fixture with fasteners. A first flange portion extends from the first end of the bracket body portion at an angle relative to the bracket body portion. A second pattern of holes is formed through the first flange portion. A second flange portion extends from the second end of the bracket body portion at an angle relative to the bracket body portion. A third pattern of holes is formed through the second flange portion. The second flange portion extends from the bracket body portion on the same side as the first flange portion such that a user can mount the bracket to the cabinet when the cabinet includes mounting holes either corresponding to the second pattern of holes or corresponding to the third pattern of holes by orienting one of the first and second flange portions against the mounting holes of the cabinet in a manner wherein the holes in said flange portion match the mounting holes in the cabinet thereby enabling said flange portion to be secured thereto with fasteners.

10 Claims, 6 Drawing Sheets

CABINET SLIDE MOUNTING BRACKET

BACKGROUND

Computer cabinets often house a series of individual computers. In order to provide access to the computers for service, the computers are mounted within the cabinet with sliding mechanisms which allow the computers to slide in and out of the cabinet. The sliding mechanisms consist of two slide fixtures which are mounted to opposite sides of the computers. The slide fixtures are in turn mounted to the cabinet by brackets. A problem occurring in the installation of the computers within the cabinets is that different cabinets employ different patterns of holes. There are typically two standards for computer cabinets, N.E.M.A. and metric. The pattern of holes in a N.E.M.A. cabinet has English dimensions while the pattern of holes in a metric cabinet have metric dimensions which differ from the English dimensions of a N.E.M.A. cabinet. As a result, although cabinets of two different standards may appear to be the same, the two cabinets require different mounting brackets.

SUMMARY OF THE INVENTION

The present invention provides a mounting bracket for mounting a computer within a cabinet in which the mounting bracket is compatible with more than one pattern of cabinet mounting holes thereby facilitating the installation of computers and sliding mechanisms within different cabinets.

The bracket includes a bracket body portion having first and second ends. A first pattern of holes is formed through the bracket body portion, enabling the bracket to be mounted to the sliding fixtures with fasteners. A first flange portion extends from the first end of the bracket body portion. The first flange portion is at an angle relative to the bracket body portion. A second pattern of holes is formed through the first flange portion. A second flange portion extends from the second end of the bracket body portion. The second flange portion is at an angle relative to the bracket body portion. A third pattern of holes is formed through the second flange portion. The second flange portion extends from the bracket body portion on the same side as the first flange portion such that a user can mount the bracket to the cabinet when the cabinet includes mounting holes either corresponding to the second pattern of holes or corresponding to the third pattern of holes by orienting one of the first and second flange portions against the mounting holes of the cabinet in a manner wherein the holes in said flange portion match the mounting holes in the cabinet thereby enabling said flange portion to be secured thereto with fasteners.

In preferred embodiments, the bracket is mounted to a structural member of the cabinet. The bracket body portion, the first flange portion and the second flange portion are substantially planar. The first and second flange portions are of different sizes and extend at a right angle from the bracket body portion. The second pattern of holes has dimensions which are different from the third pattern of holes. Two leg portions extend along opposite sides of the bracket body portion at an angle relative to the bracket body portion.

BRIEF DESCRIPTION OF THE DRAWINGS

The foregoing and other objects, features and advantages of the invention will be apparent from the following more particular description of preferred embodiments of the drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

Figure 1:
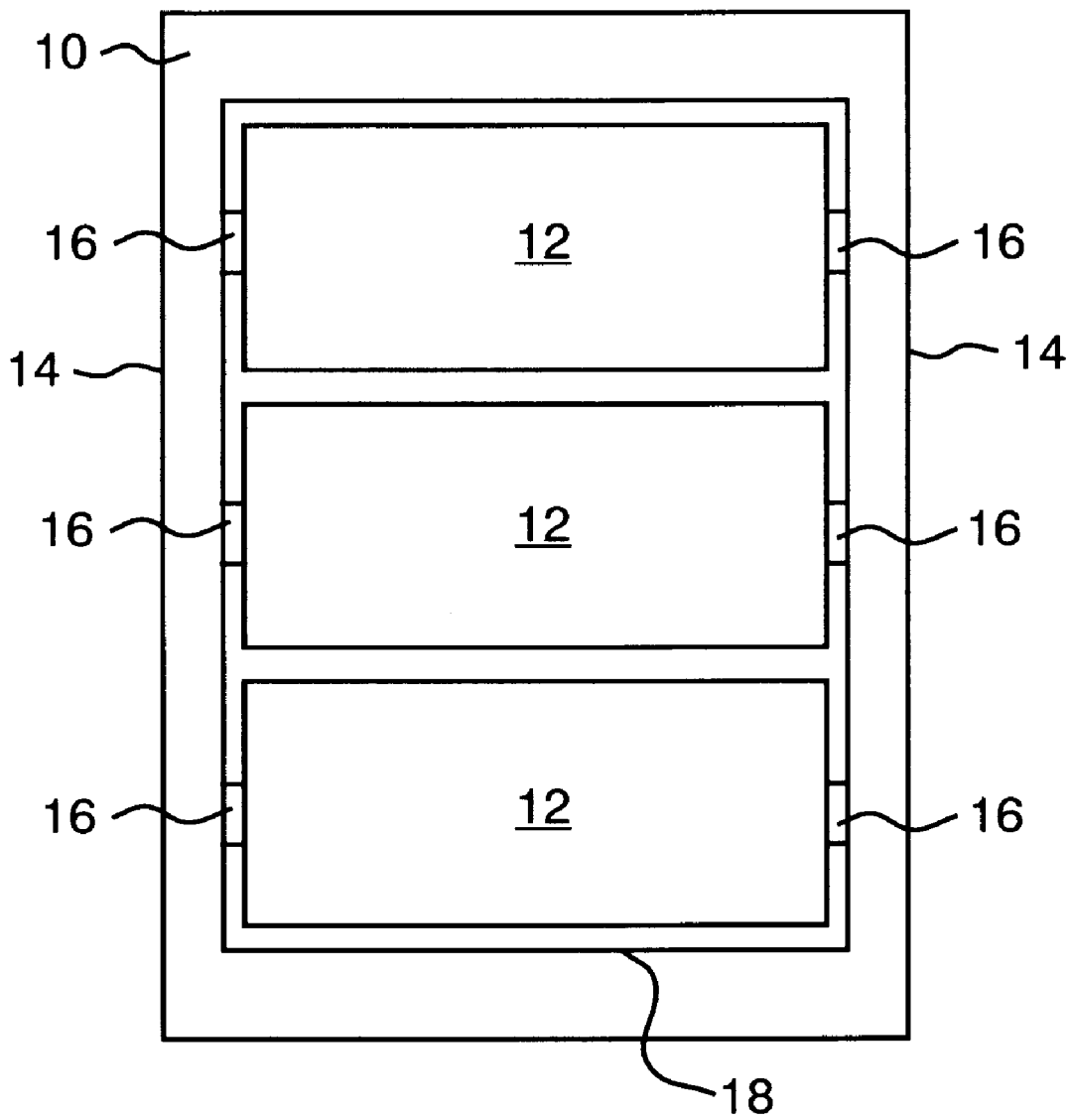
FIG. 1 is a front view of a computer cabinet with a series of individual computers installed therein.

Referring to FIG. 1, computer cabinet 10 has three computers 12 installed within the interior 18 of the cabinet 10. Each computer 12 is slidably mounted within cabinet 10 by sliding mechanisms consisting of two sliding fixtures 16 which are mounted to opposite sides of each computer 12 and to opposite sides 14 of computer enclosure 10.

Referring to FIGS. 2–8, cabinet 10 includes four generally channel shaped structural members 20 extending vertically on the interior of sides 14 near the front and rear ends of cabinet 10. Each structural member 20 includes a flange 26 extending along one side of the structural member 20 and oriented perpendicular to the surfaces of sides 14. Flange 26 has a pattern of holes 22 formed therethrough along the length of flange 26. Each sliding fixture 16 is secured to the two structural members 20 which are on opposite sides 14 of cabinet 10 by two mounting brackets 24.

Each mounting bracket 24 includes two substantially planar flange portions 28 and 30 which extend from a substantially planar bracket body portion 38. Flange portions 28 and 30 extend at right angles from opposite ends of bracket body portion 38 such that flange portions 28 and 30 face each other. Two legs 36 extend from bracket body portion 38 along the upper and lower sides of bracket body portion 38. Legs 36 extend outwardly away from bracket body portion 38 at an angle relative to bracket body portion 38 on the opposite side that flange portions 28 and 30 extend. Legs 36 engage and capture sliding fixtures 16 therebetween to help lock mounting brackets 24 thereon. Legs 36 also provide structural rigidity to mounting bracket 24.

Bracket body portion 38 includes a central elongated slot 32 extending along a substantial length of bracket body portion 38 and two holes 34 positioned on opposite ends of slot 32. The slot 32 and holes 34 enable each mounting bracket 24 to be mounted to the sliding fixtures 16 with fasteners such as screws. Flange portion 28 includes a pattern of three horizontally elongated slotted holes 28a which are vertically positioned above each other. Flange portion 30 also includes a pattern of three horizontally elongated slotted holes 30a which are vertically positioned above each other but are spaced further apart than holes 28a. Slotted holes 28a and 30a allow mounting bracket 24 to be secured to flange 26 of structural member 20 with fasteners through holes 22. Slotted holes 28a and 30a are long enough to provide some room for adjusting sliding fixtures 16 inwardly towards or outwardly away from each other. Slotted holes 28a/30a can also compensate for slightly misaligned holes. Depending upon the manufacturing standard of cabinet 10, the pattern of holes 22 located on flanges 26 of structural members 20 can match either the pattern of slotted holes 28a of flange 28 or the pattern of slotted holes 30a of flange 30. Therefore, only one flange 28 or 30 of a mounting bracket 24 is mounted to a structural member 20.

Figure 2:
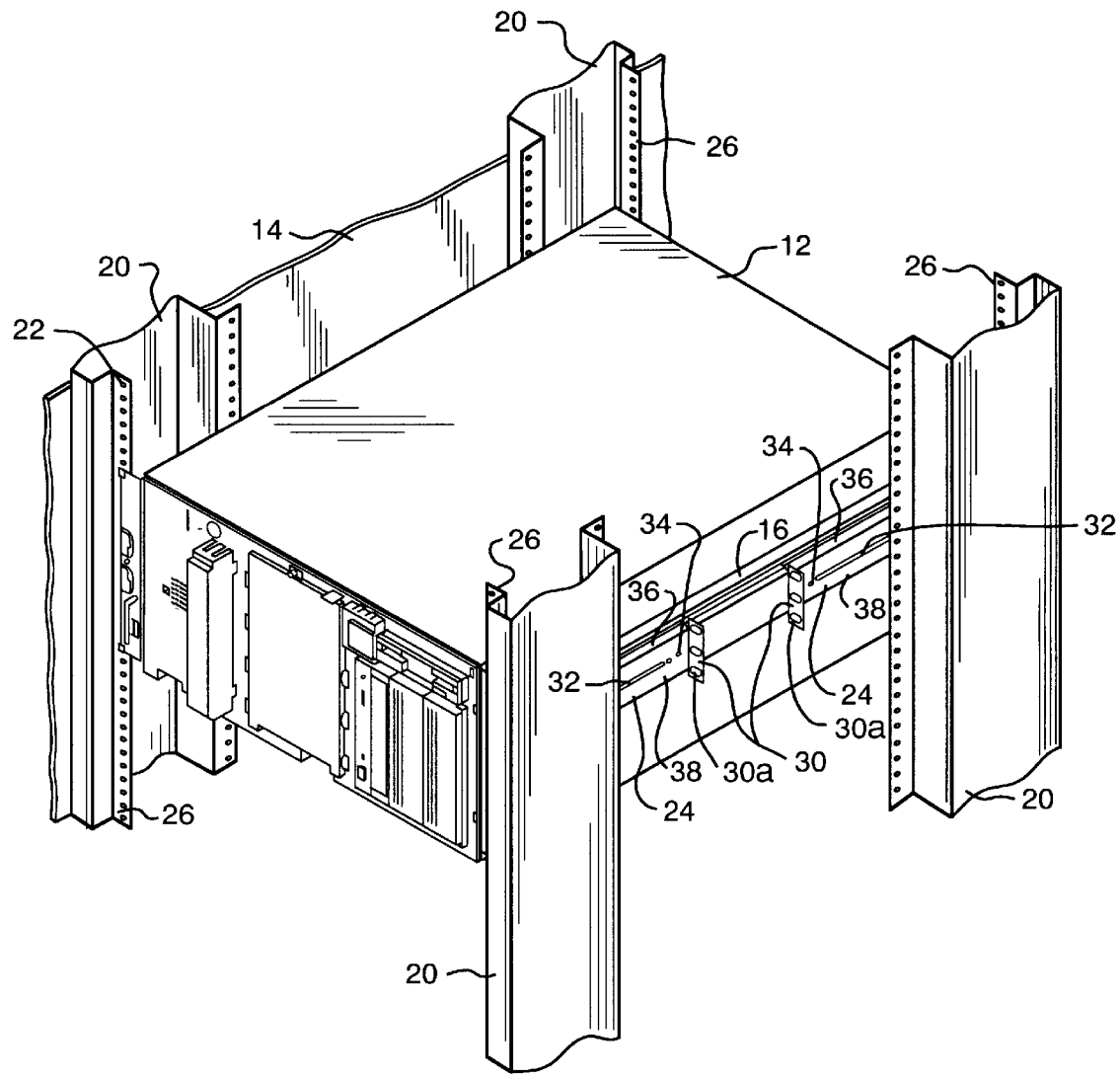
FIG. 2 is a broken away perspective view of a computer mounted within the cabinet by mounting brackets of the present invention.
Figure 3:
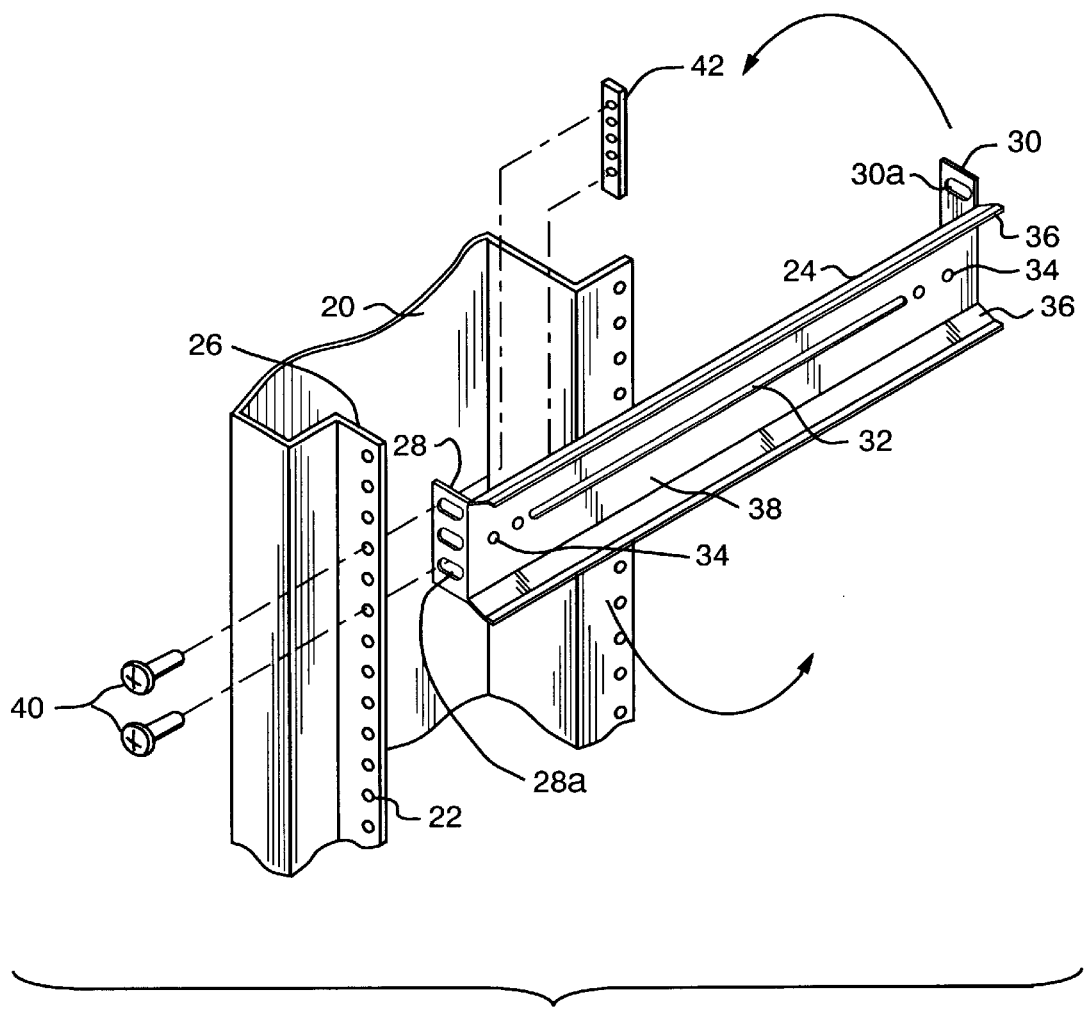
FIG. 3 is a perspective view depicting the mounting of a mounting bracket to a structural member of the cabinet.
Figure 4:
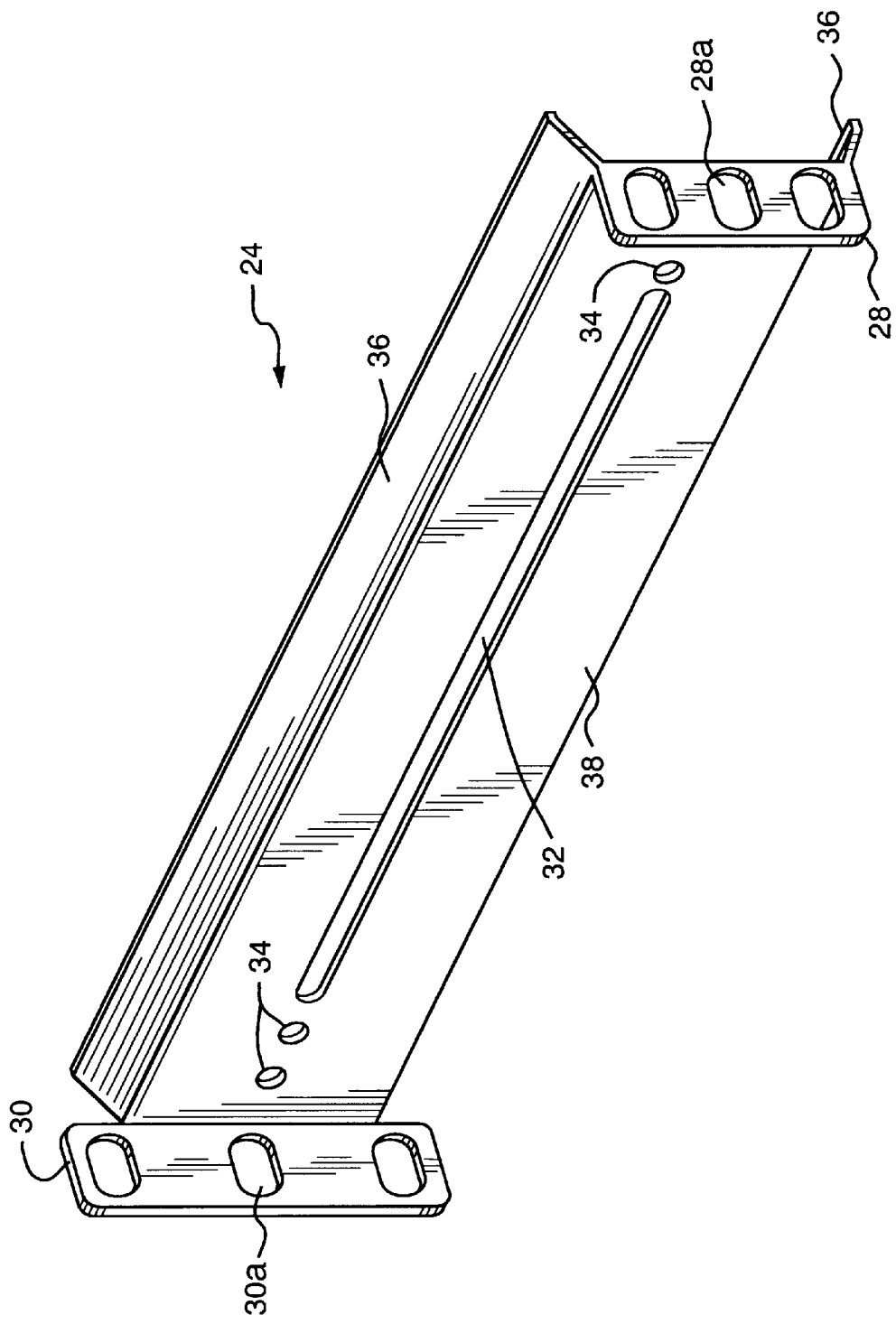
FIG. 4 is a perspective view of the mounting bracket.
Figure 5:
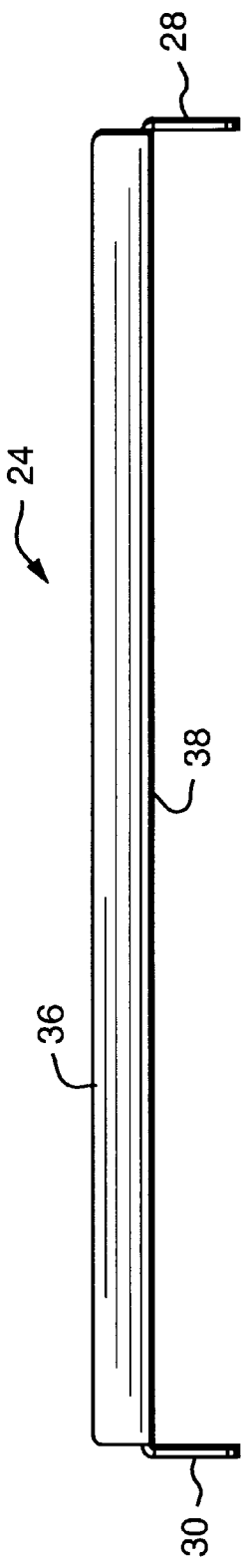
FIG. 5 is a top view of the mounting bracket.
Figure 6:
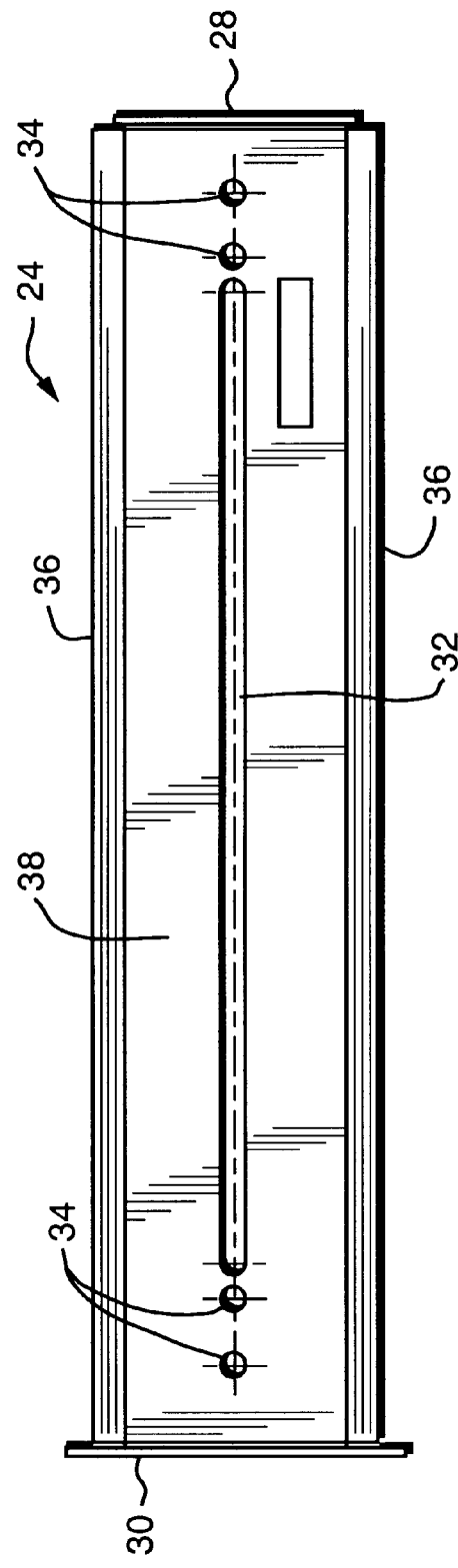
FIG. 6 is a front view of the mounting bracket.
Figure 8:
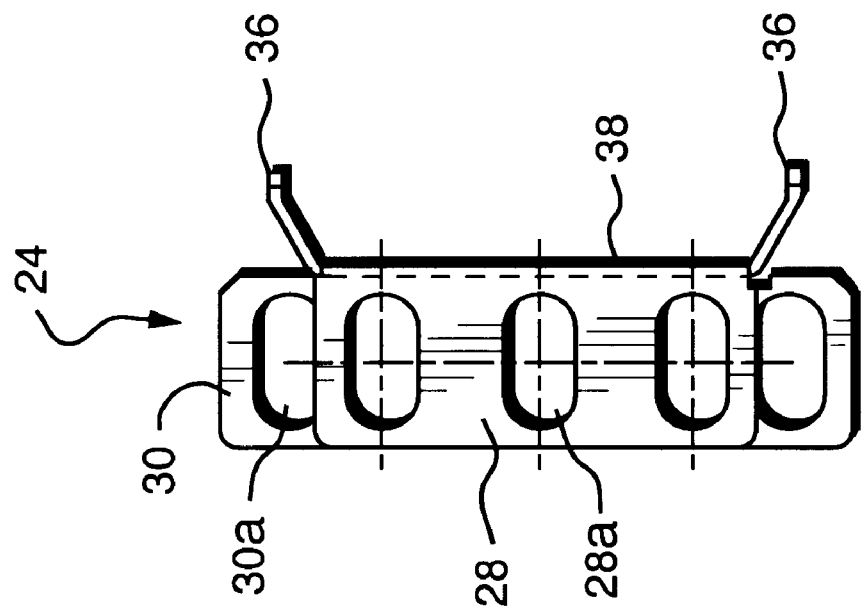
FIG. 8 is a right end view of the mounting bracket.
Figure 7:
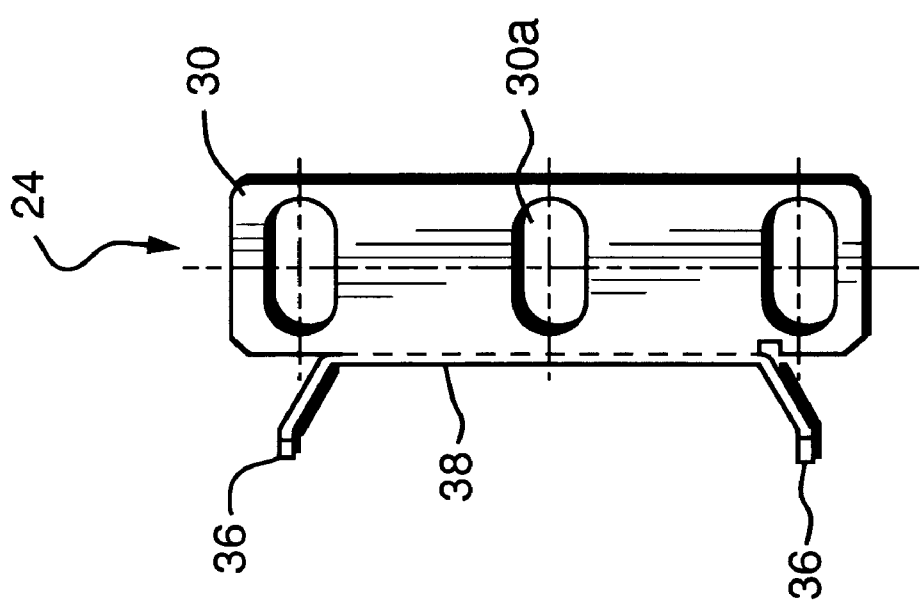
FIG. 7 is a left end view of the mounting bracket.

In order to mount a computer 12 within cabinet 10, four mounting brackets 24 are mounted to respective flanges 26 of structural members 20. Each mounting bracket 24 is rotated as depicted by the arrows in FIG. 3 to position either flange 28 against a flange 26 of a structural member 20 or flange 30 against a flange 26 of a structural member 20 depending upon the nature of the pattern of holes 22 so that the flange with the holes corresponding to the pattern of holes 22 is aligned thereto. This flange is mounted to the structural member 20 with screws 40 and a backing plate 42 having threaded holes corresponding to the pattern of holes 22 in flange 26. The four mounting brackets 24 are oriented so that the flanges which are not mounted to a structural member 20 are positioned between the structural members 20 and are facing each other as depicted in FIG. 2. Each sliding fixture 16 has an inner fixture piece and an outer fixture piece which are then separated from each other. Each outer fixture piece of sliding fixture 16 is mounted to a pair of mounting brackets 24 with screws through slots 32 and holes 34 while each inner fixture piece of sliding fixture 16 is mounted to opposite sides of computer 12. The inner fixture pieces of sliding fixture 16 are then re-engaged with the outer fixture pieces, thereby completing the installation of the computer 12 within cabinet 10.

More particular details of mounting bracket 24 are now described. Mounting bracket 24 is preferably about 263.65 mm long and 54.2 mm high. Elongated slot 32 is 4.6 mm wide by 196.6 mm long and holes 34 are 4.6 mm in diameter. Flange portion 28 is 18.30 mm wide and 44.5 mm high while flange portion 30 is 18.30 mm wide and 64.1 mm high. The elongated slotted holes 28a in flange portion 28 correspond with the pattern of holes 22 in a N.E.M.A. cabinet, are 3.70 mm wide by 14 mm long and are spaced apart 15.7 mm. The elongated slotted holes 30a in flange portion 30 correspond with the pattern of holes 22 in a metric cabinet, are 3.70 mm wide by 14 mm long and are spaced apart from each other by 25.0 mm. Slotted holes 28a/30a will accommodate a range of hole sizes of holes 22 up to 7.2 mm in diameter. By dimensioning, the pattern of holes 28a within flange portion 28 differently than the pattern of holes 30a in flange portion 30, the same mounting bracket 24 can be employed in two different standards of cabinets. This reduces the amount of parts required on hand to install computers within two different cabinets. Mounting bracket 24 is preferably fabricated from sheet metal that is 1.52 mm thick and is zinc plated but, alternatively, mounting bracket 24 can be molded. Bracket 24 is compatible with both N.E.M.A. and metric computer cabinets without having two patterns of holes through a single flange portion. This is advantageous because a single flange portion with two patterns of holes has decreased strength and rigidity. Although particular dimensions are given above for mounting bracket 24, these dimensions can be varied depending upon the dimensions of the computer cabinet 10, computer 12 and sliding fixtures.

Equivalents

While this invention has been particularly shown and described with references to preferred embodiments thereof, it will be understood by those skilled in the art that various changes in form and details may be made therein without departing from the spirit and scope of the invention as defined by the appended claims. For example, mounting bracket 24 can be sized to accommodate hole spacings or hole sizes in cabinet 10 which are different than specified above. For instance, the computer cabinet does not have to be a standard N.E.M.A. or metric cabinet but can merely have different hole spacings and/or hole sizes. In addition, the different sized holes can be either metric or English units.

What is claimed is:

1. A bracket system for mounting a sliding fixture to a computer cabinet for enabling a computer to slide relative to the computer cabinet comprising:

a first bracket for mounting to and supporting a first end of the sliding fixture; and a second bracket for mounting to and supporting a second end of the sliding fixture, the first and second brackets each comprising:

a bracket body portion having first and second ends and first and second sides, a first pattern of holes being formed through the bracket body portion enabling each bracket to be mounted to the sliding fixture with fasteners;

a first flange portion extending from the first end of the bracket body portion, the first flange portion being at an angle relative to the bracket body portion, a second pattern of holes being formed through the first flange portion; and a second flange portion extending from the second end of the bracket body portion, the second flange portion being at an angle relative to the bracket body portion, a third pattern of holes being formed through the second flange portion, the first and second flange portions extending from the first side of the bracket body portion such that a user can mount the first and second brackets to the cabinet when the cabinet includes mounting holes corresponding to one of the second and third pattern of holes by orienting only one of the first and second flange portions of each bracket against the mounting holes of the cabinet in a manner wherein the holes in said flange portion of each bracket match the mounting holes in the cabinet to enable said flange portion of each bracket to be secured to the cabinet with fasteners.

2. The bracket system of claim 1 in which the first and second flange portions extend at a right angle from the bracket body portion.

3. The bracket system of claim 1 in which the second pattern of holes have dimensions which are different than the third pattern of holes.

4. The bracket system of claim 3 in which the first flange portion is a different size than the second flange portion.

5. The bracket system of claim 1 in which the bracket body portion, the first flange portion and the second flange portion are each substantially planar.

6. The bracket system of claim 1 further comprising two leg portions extending along opposite sides of the bracket body portion at an angle relative to the bracket body portion from the second side of the bracket body portion.

7. A bracket system for mounting a sliding fixture to a computer cabinet for enabling a computer to slide relative to the computer cabinet comprising:

a first bracket for mounting to and supporting a first end of the sliding fixture; and a second bracket for mounting to and supporting a second end of the sliding fixture, the first and second brackets each comprising:

a substantially planar bracket body portion having first and second ends and first and second sides, a first pattern of holes being formed through the bracket body portion enabling each bracket to be mounted to the sliding fixture with fasteners;

a first substantially planar flange portion extending from the first end of the bracket body portion, the first flange portion being at an angle relative to the bracket body portion, a second pattern of holes being formed through the first flange portion; and a second substantially planar flange portion extending from the second end of the bracket body portion, the second flange portion being at an angle relative to the bracket body portion, a third pattern of holes being formed through the second flange portion, the third pattern of holes having different dimensions than the second pattern of holes, the first and second flange portions extending from the first side of the bracket body portion such that a user can mount the first and second brackets to the cabinet when the cabinet includes mounting holes corresponding to one of the second and third pattern of holes by orienting only one of the first and second flange portions of each bracket against the mounting holes of the cabinet in a manner wherein the holes in said flange portion of each bracket match the mounting holes in the cabinet to enable said flange portion of each bracket to be secured to the cabinet with fasteners.

8. The bracket system of claim 7 further comprising two leg portions extending along opposite sides of the bracket body portion at an angle relative to the bracket body portion from the second side of the bracket body portion.

9. The bracket system of claim 7 in which the first and second flange portions extend at a right angle from the bracket portion.

10. The bracket system of claim 7 in which the first flange portion is a different size than the second flange portion.

* * * * *